(12) United States Patent
Zhu et al.

(10) Patent No.: US 8,716,799 B2
(45) Date of Patent: May 6, 2014

(54) MOSFET

(75) Inventors: Huilong Zhu, Poughkeepsie, NY (US);
Miao Xu, Beijing (CN); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 9 days.

(21) Appl. No.: 13/376,996

(22) PCT Filed: Aug. 1, 2011

(86) PCT No.: PCT/CN2011/077856
§ 371 (c)(1),
(2), (4) Date: Dec. 8, 2011

(87) PCT Pub. No.: WO2012/174769
PCT Pub. Date: Dec. 27, 2012

(65) Prior Publication Data
US 2012/0326231 A1 Dec. 27, 2012

(30) Foreign Application Priority Data
Jun. 23, 2011 (CN) .......................... 2011 1 0170875

(51) Int. Cl.
*H01L 27/01* (2006.01)
*H01L 27/12* (2006.01)
*H01L 31/0392* (2006.01)

(52) U.S. Cl.
USPC ............................................ 257/347; 438/51

(58) Field of Classification Search
USPC ............................................ 257/347; 438/51
See application file for complete search history.

(56) References Cited

U.S. PATENT DOCUMENTS

| 6,391,695 | B1* | 5/2002 | Yu .................................. 438/166 |
| 2002/0063285 | A1* | 5/2002 | Wu et al. ........................ 257/347 |
| 2010/0237417 | A1* | 9/2010 | Wang et al. .................... 257/347 |
| 2013/0009244 | A1* | 1/2013 | Zhu et al. ....................... 257/347 |

OTHER PUBLICATIONS

"Scaling the Si MOSFET: From bulk to SOI to bulk", by Yan et al., IEEE Trans. Elect. Dev., vol. 39, starting at p. 1704, 6 total pages, Jul. 1992.

* cited by examiner

*Primary Examiner* — Phuc Dang
(74) *Attorney, Agent, or Firm* — Westman, Champlin & Koehler, P.A.

(57) ABSTRACT

The present application discloses a MOSFET and a method for manufacturing the same, wherein the MOSFET comprises: an SOI wafer, which comprises a semiconductor substrate, a buried insulator layer, and a semiconductor layer, the buried insulator layer being disposed on the semiconductor substrate, and the semiconductor layer being disposed on the buried insulator layer; a gate stack, which is disposed on the semiconductor layer; a source region and a drain region, which are disposed in the semiconductor layer and on opposite sides of the gate stack; and a channel region, which are disposed in the semiconductor layer and sandwiched by the source region and the drain region, wherein the MOSFET further comprises a back gate disposed in the semiconductor substrate, and wherein the back gate comprises first, second and third compensation doping regions, the first compensation doping region is disposed under the source region and the drain region; the second compensation doping region extends in a direction away from the channel region and adjoining the first compensation doping region; and the third compensation doping region is disposed under the channel region and adjoining the first compensation doping region. By changing the doping type of the back gate, the MOSFET can have an adjustable threshold voltage, and can have a reduced parasitic capacitance and a reduced contact resistance in connection with the back gate.

8 Claims, 6 Drawing Sheets

MOSFET

CROSS-REFERENCE TO RELATED APPLICATIONS

This application is a National Phase application of, and claims priority to, No. PCT/CN2011/077856, filed on Aug. 1, 2011, entitled "MOSFET AND METHOD FOR MANUFACTURING THE SAME", which claims to the Chinese Patent Application No. 201110170875.2, filed on Jun. 23, 2011, both the PCT Application and Chinese Application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

In the MOSFETs, it may be desirable on one hand that the threshold voltage of the device is increased to suppress the short channel effects, and on the other hand that the threshold voltage of the device is decreased to reduce power consumption in a low supply voltage application, or in an application using both P-type and N-type MOSFETs.

Channel doping is a known approach of tuning the threshold voltage. However, if the threshold voltage of the device is raised by increasing the doping concentration in the channel region, mobility of carriers drops, which results in a degradation of the device performance. Moreover, ions with a high doping concentration in the channel region may neutralize ions in source/drain regions and ions in regions which adjoin the channel region, which decreases a doping concentration in the region adjacent to the channel region and increases resistance of the device.

It is proposed by Yan et al. in "Scaling the Si MOSFET: From bulk to SOI to bulk", IEEE Trans. Elect. Dev., Vol. 39, p. 1704, July 1992, that short channel effects can be suppressed by disposing a ground plane (i.e. a grounded back gate) under a buried insulator layer in an SOI MOSFET.

However, the above SOI MOSFET comprising a grounded back gate still can not meet the requirement of the device for the threshold voltage when the channel length of the semiconductor device is kept shrinking.

Therefore, it is still desirable that the threshold voltage of the semiconductor device is adjusted in a controllable manner without increasing the doping concentration in the channel, while the performance of the semiconductor device is not deteriorated.

SUMMARY OF THE DISCLOSURE

The object of the present disclosure is to provide a MOSFET having a threshold voltage adjustable by a back gate.

According to one aspect of the present disclosure, there is provided a MOSFET comprising an SOI wafer, which comprises a semiconductor substrate, a buried insulator layer, and a semiconductor layer, the buried insulator layer being disposed on the semiconductor substrate, and the semiconductor layer being disposed on the buried insulator layer; a gate stack, which is disposed on the semiconductor layer; a source region and a drain region, which are disposed in the semiconductor layer and on opposite sides of the gate stack; and a channel region, which are disposed in the semiconductor layer and sandwiched by the source region and the drain region, wherein the MOSFET further comprises a back gate disposed in the semiconductor substrate, and wherein the back gate comprises first, second and third compensation doping regions, the first compensation doping region is disposed under the source region and the drain region; the second compensation doping region extends in a direction away from the channel region and adjoining the first compensation doping region; and the third compensation doping region is disposed under the channel region and adjoining the first compensation doping region.

According to another aspect of the disclosure, there provides a method for manufacturing a semiconductor structure, comprising:

providing an SOI wafer, which comprises a semiconductor substrate, a buried insulator layer, and a semiconductor layer, the buried insulator layer being disposed on the semiconductor substrate, and the semiconductor layer being disposed on the buried insulator layer;

forming a dummy gate on the semiconductor layer;

performing an ion doping for providing a back gate with a dopant of a first doping polarity, the back gate being in the semiconductor substrate;

performing an ion doping for providing a source region and a drain region in the semiconductor layer;

performing a first compensation doping with a dopant of a second doping polarity to form a first compensation doping region in the back gate, the first compensation doping region being disposed under the source region and the drain region, and the first doping polarity being opposite to the second doping polarity;

performing a second compensation doping with a dopant of the first doping polarity to form a second compensation doping region in the back gate, the second compensation doping region extending in a direction away from the channel region and adjoining the first compensation doping region;

removing the dummy gate to form a gate opening;

performing a third compensation doping with a dopant of the second doping polarity through the gate opening to form a third compensation doping region in the back gate, the third compensation doping region being disposed under the channel region and adjoining the first compensation doping region, forming a gate stack in the gate opening.

In the present disclosure, the doped back gate is disposed under the channel region which is preferably not doped, such that a PN junction between the channel region and either of the source region and the drain region is not formed. It reduces a leakage current of the semiconductor device.

In the present disclosure, the threshold voltage can be adjusted according to a length of the channel. For example, if the length of the channel region of the semiconductor device decreases, the threshold voltage will possibly decrease. The threshold voltage of the semiconductor device can be increased by doping the backgate with the dopant of the same type as the doping polarity of the SOI MOSFET. On the contrary, if the threshold voltage is too large, the threshold voltage of the semiconductor device can be decreased by doping the backgate with the dopant of the type opposite to the doping polarity of the SOI MOSFET.

In the present disclosure, the first, second and third compensation doping regions are formed in the back gate such that a non-uniform doping profile is introduced. The buried insulator layer is used as a gate dielectric layer of the back gate. When the back gate is applied with a bias voltage, the back gate in turn applies a non-uniform bias electric field to the source region, the drain region and the channel region to control the electric characteristic of the MOSFET. Therefore, short channel effects in the MOSFET are suppressed. The MOSFET can have a reduced parasitic capacitance and a reduced contact resistance in connection with the back gate.

DETAILED DESCRIPTION

Exemplary embodiments of the present disclosure will be described in more details below with reference to the accompanying drawings. For the sake of clarity, various components in the attached drawings are not drawn to scale.

Some particular details of the disclosure will be described below, such as an exemplary semiconductor structure, material, dimension, process step and manufacturing method of the device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including all of the layers and regions having been formed.

According to one preferable embodiment according to the present disclosure, the steps shown in FIGS. 1 to 11 are performed for manufacturing a MOSFET according to the present disclosure.

Figure 1:
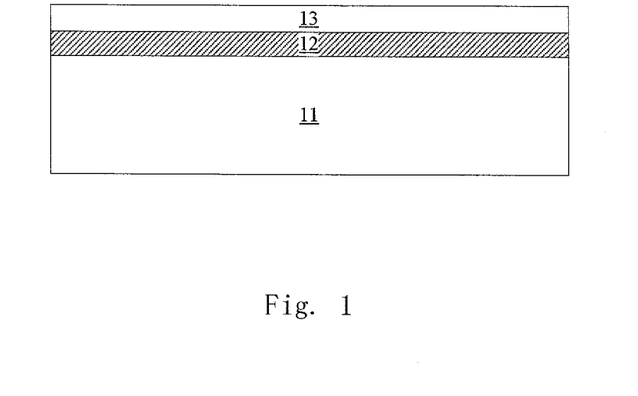
FIGS. 1-11 schematically show cross-sectional views in various stages of a method for manufacturing MOSFET according to the present disclosure, respectively, wherein FIGS. 5-9 also show a doping profile curve of the back gate.

As shown in FIG. 1, an SOI wafer is used as an initial structure of the semiconductor substrate, comprising a semiconductor substrate 11, a buried insulator layer 12 and a semiconductor layer 13, from bottom to top. The semiconductor layer 13 may have a thickness of about 5 nm to 20 nm, such as 10 nm or 15 nm. Moreover, the buried insulator layer 12 may have a thickness of 5 nm to 30 nm, such as 10 nm, 15 nm, 20 nm or 25 nm. The buried insulator layer 12 may be one of a buried oxide layer, a buried oxynitride layer, and any other buried insulator layer.

The semiconductor substrate 11 may be used for providing a back gate for the MOSFET. The semiconductor substrate 11 may be made of bulk silicon, Group IV semiconductor materials (such as SiGe or Ge), or Group III-V semiconductor materials (such as GaAs). The semiconductor layer 13 may be made of a semiconductor material selected from the group consisting of group-IV semiconductor (such as Si, Ge or SiGe) and group III-V compound semiconductor (such as GaAs). In the present embodiment, the semiconductor layer 13 may be monocrystalline silicon or SiGe. The semiconductor layer 13 will be used for providing a source region, a drain region and a channel region of the MOSFET.

The process for providing an SOI wafer is well known in the art. For example, a SmartCut™ process (referred as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen doping region at a predetermined depth in the silicon body below the surface oxide layer; converting the hydrogen doping region to a layer having micro-cavities for subsequent separation, under the conditions of an increased pressure and an increased temperature; and separating one of the two wafers from the other of the two wafers. The wafer including a surface oxide layer bonded with the semiconductor substrate is used as an SOI wafer. By controlling process parameters in the thermal oxidation or in the deposition, a thickness of the buried insulator layer in the SOI wafer can be changed. By controlling implantation energy during the hydrogen implantation, a thickness of the semiconductor layer in the SOI wafer can be varied.

Figure 2:
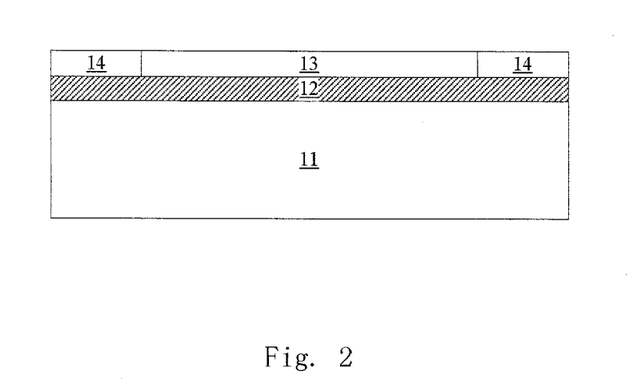

A trench is then formed by patterning the semiconductor layer 13. An insulating material fills the trench so as to form a shallow trench isolation (STI) 14 for defining an active region of the MOSFET, as shown in FIG. 2.

The patterning process may involve the following steps: forming a photoresist mask having a pattern therein on the semiconductor layer 13, by a conventional lithographical process including exposure and development steps; removing the exposed portion of the semiconductor layer 13 by dry etching such as ion beam milling, plasma etching, reactive ion etching, laser ablation and the like, or wet etching using a solution of etchant, stopping on the top of the buried insulator layer 12; and then removing the photoresist mask by ashing or dissolution in a solvent.

Figure 3:
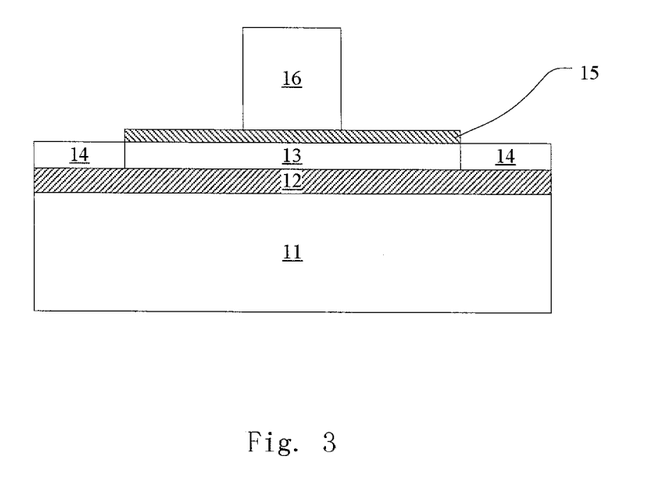

Next, a dummy gate stack is formed on the semiconductor layer 13, as shown by FIG. 3. The dummy gate stack may comprise a gate dielectric layer 15 and a dummy gate 16. The gate dielectric layer 15 may have a thickness of about 1 nm to 4 nm and the dummy gate 16 may have a thickness of about 30 nm to 100 nm. Alternatively, the gate dielectric layer 15 may not be included. The deposition process and patterning processes for forming the gate stack are known in the art, in which the gate conductor 16 is typically patterned into a stripe shape.

The gate dielectric layer 15 may be made of one of oxides, oxynitrides and high-K materials (such as, one of $HfO_2$, HfSiO, HfSiON, HfTaO, HfTiO, HfZrO, $Al_2O_3$, $La_2O_3$, $ZrO_2$ and LaAlO, or any combination thereof), or any combination thereof. The dummy gate 16 may be of a metal layer, a doped polysilicon layer, or a stack of a metal layer and a doped polysilicon layer. Alternatively, the dummy gate 16 may comprise an insulating material, such as silicon oxide, silicon oxynitride or silicon nitride.

The channel region comprises the portion (not shown) of the semiconductor layer 13 below the gate stack, and is preferably undoped or self-doped or doped in a previous independent ion doping process.

Figure 4:
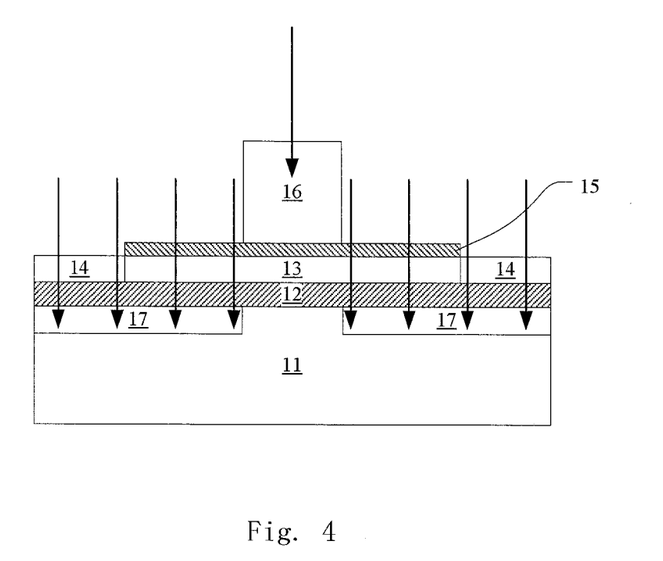

Next, an ion doping is performed through the gate dielectric layer 15, the semiconductor layer 13 and the buried insulator layer 12 on opposite sides of the dummy gate 16 into the semiconductor substrate 11, with the dummy gate 16 as a hard mask, as shown in FIG. 4. Because a total thickness of the gate dielectric layer 15, the semiconductor layer 13 and the buried insulator layer 12 is only about 10-50 nm, the implanted ions easily penetrate these layers and reach the semiconductor substrate 11. A depth of implantation is controlled by changing implantation energy and dose, so that the implanted ions are distributed mainly in the semiconductor substrate 11.

The resultant ion doping region may be distributed in an upper portion of the semiconductor substrate 11 and adjoins the buried insulator layer 12. Alternatively, the resultant ion doping region is separated from the above buried insulator layer 12 for a certain distance and does not adjoin it directly (not shown).

Due to the blocking by the dummy gate 16, the doping profile is influenced by an ion doping angle. If ions are implanted in a direction perpendicular to the main surface of the SOI wafer in the ion doping for forming the back gate, the portion of the semiconductor substrate 11 under the dummy gate 16 has a doping concentration less than that of the remaining portions of the semiconductor substrate 11, as shown in FIG. 4. If ions are implanted in a tilt angle with respect to the main surface of the SOI wafer in the ion doping for forming the back gate, the portion of the semiconductor substrate under the dummy gate has a doping concentration larger than that of the remaining portions of the semiconductor substrate (not shown).

The type of the dopant implanted in the ion doping step depends on a doping polarity of the MOSFET and a target value of the threshold voltage. To lower the threshold voltage of the semiconductor device, a p-type dopant may be used for a p-type MOSFET, such as boron (B or $BF_2$), indium (In) or their combinations; and an n-type dopant may be used for an n-type dopant, such as arsenic (As), phosphorus (P) or their combinations. To increase the threshold voltage of the semiconductor device, an n-type dopant may be used for a p-type MOSFET, such as arsenic (As), phosphorus (P) or their combinations; and a p-type dopant may be used for an n-type MOSFET, such as boron (B or $BF_2$), indium (In) or their combinations.

A dose of the dopant can be determined according to technological level and product requirements, and may be, for example, about $1 \times 10^{13}$ cm$^{-2}$ to $1 \times 10^{15}$ cm$^{-2}$. In such case, the portion of the back gate not under the channel region may have a doping concentration of about $10^{17\text{-}20}$ cm$^{-3}$. The portion of the back gate under the channel region may have a doping concentration of about $10^{15\text{-}18}$ cm$^{-3}$.

In the following example, an N-type MOSFET will be described, which has a channel region adjustable with compensation doping regions for increasing a threshold voltage of the semiconductor device. For such an N-type MOSFET, a P-type dopant is used in the ion doping for forming a back gate which has a doping polarity opposite to that of the N-type source region and the N-type drain region.

In the subsequent steps shown in FIGS. 5 to 9, varied doping profiles of the back gate 17 will be further explained.

Figure 5:
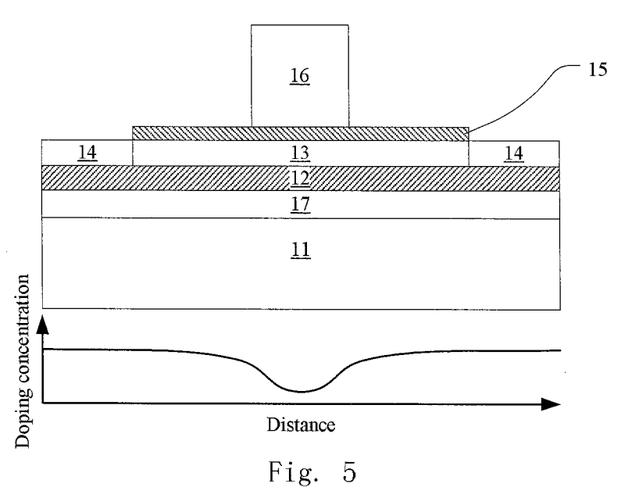

As shown in FIG. 5, an anneal is performed for a short time after the ion doping, which is also known as spike anneal, for example by using laser, electron beam or infrared radiation, so as to remedy damages in lattice and activate the implanted dopant. Due to the anneal for the ion doping, the implanted dopant diffuses again to provide a doping profile extending laterally under the dummy gate 16.

Due to the lateral extension, the back gate 17 has a doping concentration which decreases towards the center of the channel region, up to a minimum value at the center of the channel region, below the channel region (see the doping profile curve in the back gate 17 in FIG. 5).

However, the anneal after ion doping at an excessively high temperature and/or for an excessively long time is not desirable, because it will eliminate the non-uniform doping profile and provide the same doping concentration everywhere below the channel region.

Figure 6:
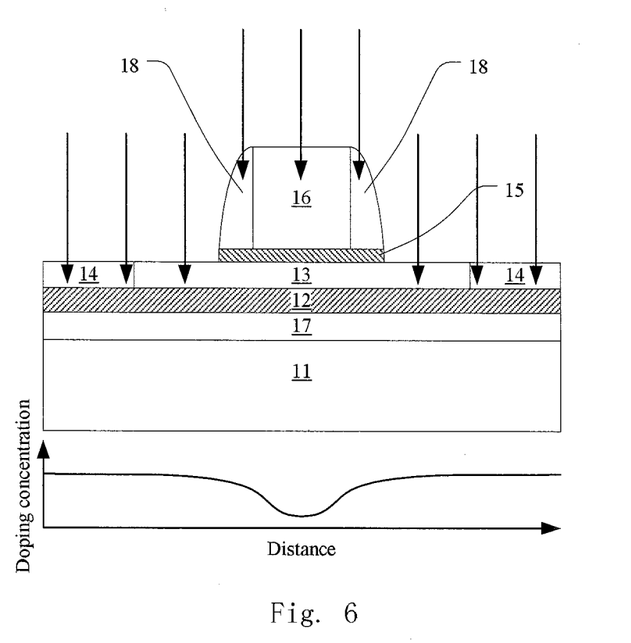

Next, a standard CMOS process may be performed, including forming spacers 18 on opposite sides of the dummy gate 16, and performing source/drain implantation with an N-type dopant (as shown in FIG. 6) to form N-type source region and an N-type drain region in the semiconductor layer 13. In the source/drain implantation, the dummy gate 16 and the spacers 18 are used together as a hard mask, and the ion doping is controlled to such a depth that the implanted ions are mainly distributed in the semiconductor layer 13, which brings substantially no change in the doping profile of the back gate 17 (see FIG. 6 which shows the doping profile curve of the back gate).

Figure 7:
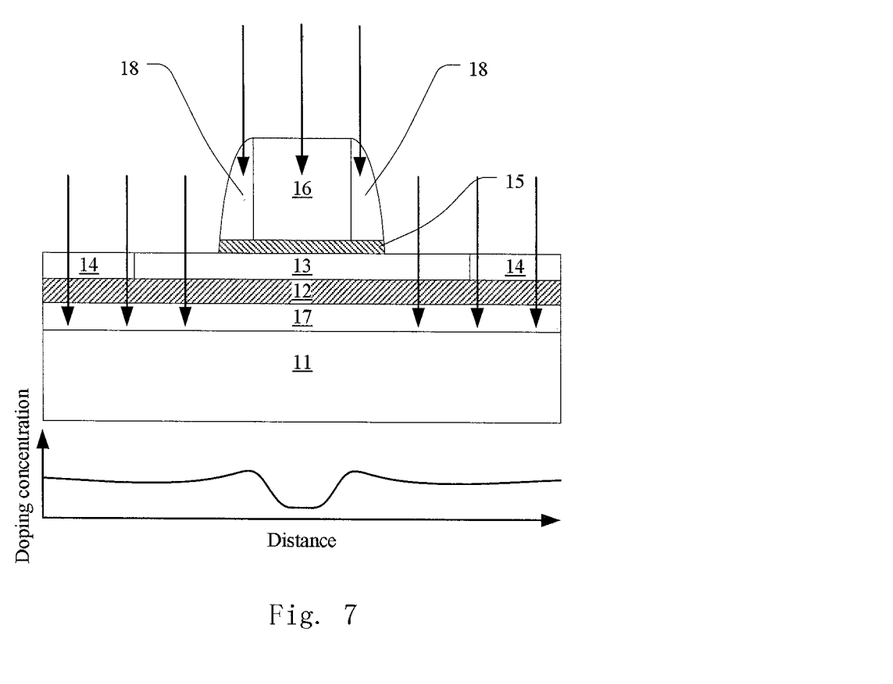

Next, with the dummy gate 16 and the spacers 18 together as a hard mask, a first compensation doping is performed with an N-type dopant on the back gate 17 (as shown in FIG. 7). The first compensation doping is controlled to a depth approximately equal to a depth of the ion doping for forming the back gate 17 as shown in FIG. 4.

The N-type dopant used in the first compensation doping may have a doping polarity opposite to the doping polarity of the P-type dopant used in the ion doping for forming the back gate as shown in FIG. 4, so as to reduce an effective doping concentration of the P-type dopant in the portions of the back gate 17 on both sides of the channel region (see FIG. 7 which shows the doping profile curve of the back gate). In the first compensation doping, the implantation dose for the dopant may be about, for example, $1 \times 10^{17}$-$1 \times 10^{19}$ cm$^{-3}$.

Because the same hard mask (i.e. the dummy gate 16 and the spacers 18) is used in the source/drain implantation as shown in FIG. 6 and the first compensation doping as shown in FIG. 7, the portion that has a reduced effective doping concentration of the P-type dopant in the back gate 17 is located under the source region and the drain region. In the present application, the first compensation doping region corresponds to the portion that has a reduced effective doping concentration of the P-type dopant due to the first compensation doping in the back gate 17.

Because the first compensation doping region has a reduced effective doping concentration of the P-type dopant, a depletion layer formed in the back gate 17 will have a larger thickness. It reduces a parasitic capacitance between the source/drain regions and the back gate 17, which in turn increases an operation frequency of the MOSFET.

Figure 8:
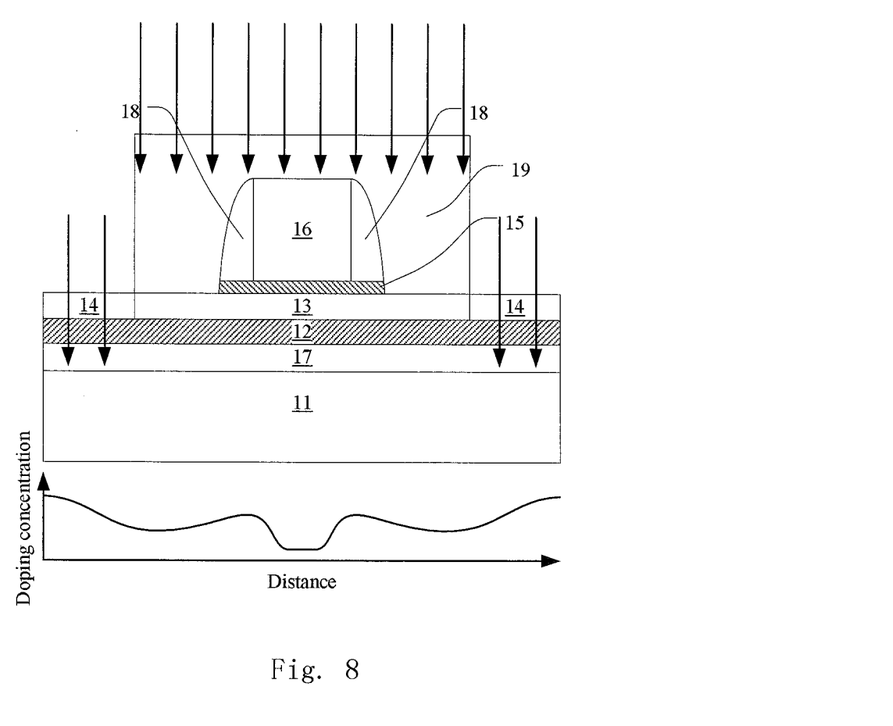

Next, a photoresist mask 19 with patterns therein is formed on the semiconductor structure, by a photolithographic process including exposure and develop. The photoresist mask 19 exposes a region outside the source region and the drain region in a direction away from the channel region. The region will be used for providing the back gate vias hole. In this example, the region used for forming the back gate vias hole is located in the shallow trench isolation 14.

A second compensation doping is performed to the back gate 17 with a P-type dopant using the photoresist mask 19, (as shown in FIG. 8). The second compensation doping is controlled to a depth approximately equal to a depth of the ion doping for forming the back gate 17 as shown in FIG. 4.

The P-type dopant used in the second compensation doping may have a doping polarity identical to the doping polarity of the P-type dopant used in the ion doping for forming the back gate as shown in FIG. 4, so as to increase an effective doping concentration of the P-type dopant in the portions of the back gate 17 under the shallow trench isolation 14 (see FIG. 8 which shows the doping profile curve of the back gate). In the present application, the second compensation doping region corresponds to the portion that has an increased effective doping concentration of the P-type dopant due to the second compensation doping in the back gate 17.

The second compensation doping region occupies a portion of the first compensation doping region outside the source region and the drain region in a direction away from the channel region. Moreover, there is a continuous change in the doping profile between the second compensation doping region and the first compensation doping region, without an apparent interface.

Contact resistance is reduced when the back gate contact is formed because the effective doping concentration of the P-type dopant in the second compensation doping region is increased. During operation of a MOSFET, an applied bias voltage acts mainly on the channel region such that the short channel effects are suppressed advantageously.

Next, the photoresist mask 19 is removed by ashing or dissolution in a solvent. An interlayer dielectric layer 20 is formed on the semiconductor structure. A part of the interlayer dielectric layer 20 is then removed by chemical-mechanical polishing (CMP). The CMP stops at the top of the dummy gate 16 so as to provide a flat surface for the semiconductor structure.

Next, the dummy gate 16 is selectively removed to form a gate opening, by wet etching or dry etching with the interlayer dielectric layer 20 and the gate dielectric layer 15 together as a mask. The portion of the gate dielectric layer 15 under the dummy gate 16 is thus exposed. In a subsequent ion doping process, the gate dielectric layer 15 will be used as a protection layer for the ion doping to reduce damages to the semiconductor substrate 11 due to the ion doping operation. Alternatively, the gate dielectric layer 15 may be also removed to expose the underlying semiconductor substrate 11.

Next, an auxiliary mask layer is formed on the whole surface of the semiconductor structure. The auxiliary mask layer may be an amorphous silicon layer. The amorphous silicon layer may have a thickness of 5 nm to 15 nm, and may be formed at a temperature of about 300° C. to 400° C. For a semiconductor device having a long gate length (relatively, the gate length L>2d), the amorphous silicon layer covers the sidewalls and the bottom of the gate opening. Next, an anisotropic etching (for example, RIE) may be performed on the amorphous silicon layer without any other mask. In other words, not only the portion of the amorphous silicon outside of the gate opening is removed, but also the portion of the amorphous silicon on the bottom of the gate opening is removed. The remaining portions of the amorphous silicon layer on an inner wall of the gate opening form spacers 21. The spacers 21 reduce a width of the gate opening. The reduced width I of the gate opening satisfies the condition I=L−2d approximately.

Figure 9:
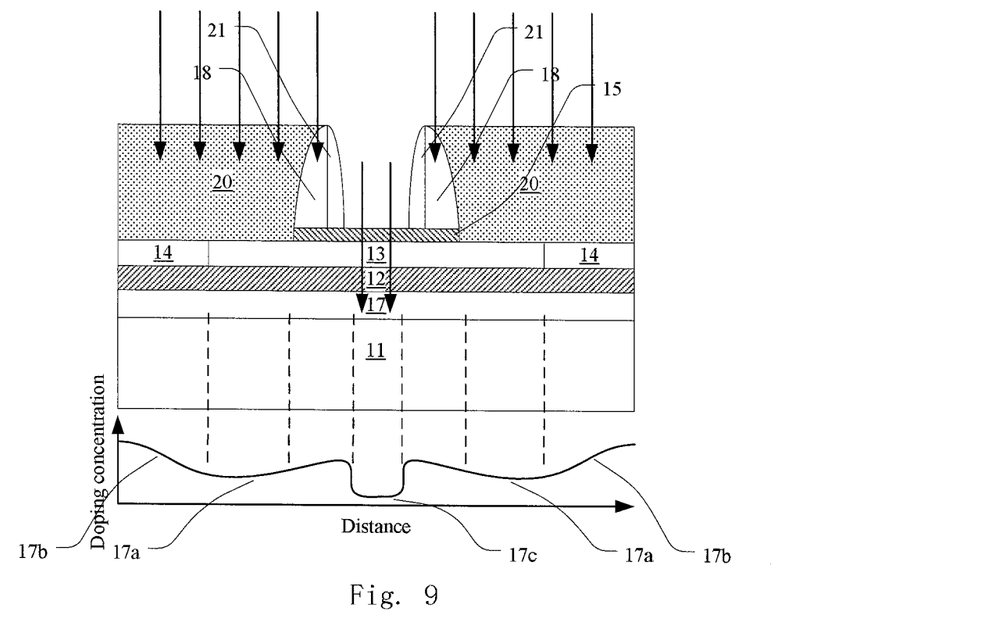

Next, a third compensation doping is performed with the gate opening having a reduced width as a window, to form a third compensation doping region in the semiconductor substrate 11, as shown by FIG. 9. By controlling power and dose for in the ion doping, the third compensation doping may be performed at a depth approximately equal to a depth for the ion doping for forming the back gate 17 as shown in FIG. 4. Moreover, the dopant used in the third compensation doping may have a doping type opposite to the doping type of the dopant used in the ion doping for forming the back gate 17 as shown in FIG. 4. In this embodiment, the dose for the third compensation doping may be about $1\times10^{13}$ cm$^{-2}$ to $1\times10^{18}$ cm$^{-2}$. After the third compensation doping region is formed, the dopants of the opposite doping types, which are provided by the third compensation doping and the ion doping for forming the back gate as shown in FIG. 4, interact with each other such that an effective doping concentration of the portion of the previously formed back gate under the channel region decreases significantly (for the purpose of reducing the threshold voltage). In other words, as for the region occupied by the third compensation doping, it still appears to be a P-type doped region for an N-type device; or, it still appears to be an N-type doped region for a P-type device. However, it has a doping concentration smaller than that of the portion of the back gate under the channel region. Furthermore, if needed in device design (for example, for increasing the threshold voltage), the region occupied by the third compensation doping may be reversed to have an opposite doping type. For example, it appears to be an N-type doped region for an N-type device; or, it appears to be a P-type doped region for a P-type device. Therefore, the portion of the back gate under the channel region is used for adjusting a doping profile of the portion of the back gate under the channel region, which facilitates flexibly adjusting the threshold voltage of the device. In the present embodiment, the doping type of the third compensation doping region may be N-type, which is opposite to the P-type back gate.

Furthermore, for a semiconductor device having a short gate length (relatively, the gate length L<2d), if the auxiliary mask layer is further formed to cover the sidewalls and the bottom of the gate opening after the back gate is formed, the auxiliary mask layer will fill up the gate opening, because the auxiliary mask layer has a thickness d. Thus, the gate opening having a reduced width cannot be formed by removing the auxiliary mask layer which covers the bottom of the gate opening. As a result, either a doping concentration in the portion of the back gate under the channel region cannot be compensated due to the blocking by the auxiliary mask layer, or a sub compensation doping region having a doping concentration smaller than the doping concentration of the compensation doping region 21, may be formed in the portion of the back gate under the channel region. It prevents the threshold voltage from being reduced to an undesirable low value.

Alternatively, the compensation doping region may have a depth larger than that of the back gate, which reduces the possibility of performance degradation by introducing implanted ions into the channel region with an amount as small as possible, when the compensation doping region is formed.

It should be noted that there is no apparent interfaces in the first, second and third compensation doping regions in the back gate 17. The locations of the first, second and third compensation doping regions are illustrated in the doping profile curve of the back gate in FIG. 9. The first compensation doping region 17a with a reduced effective doping concentration of P-type dopant is located under the source region and the drain region. The second compensation doping region 17b with an increased effective doping concentration of P-type dopant extends in a direction away from the channel region and adjoining the first compensation doping region 17a. The third compensation doping region 17c with an effective doping concentration of N-type is located under the channel region and adjoining the first compensation doping region 17a.

Next, an anneal is performed for a short time, for example, by using laser, electron beam or infrared radiation, so as to remedy damages in the lattice and activate the implanted dopant in the first, second and third compensation doping regions. Due to the anneal for the ion doping, the implanted dopant diffuses again. However, the third compensation doping region includes the dopant having an opposite doping type, and thus has a concentration of the dopant changing abruptly at its interface with the back gate. It provides an abrupt change in the doping profile curve in the back gate shown in FIG. 9.

A short channel (not shown) is formed in the portion of the semiconductor layer 13 above the third compensation doping region. Compared with a conventional long channel, the short channel receives a smaller amount of dopant.

When a bias voltage is applied to the back gate 17, the third compensation doping region in the back gate region 17 provides an electrical field, different from other portions of the back gate 17. The electric characteristic may be controlled to compensate the short channel effects in the MOSFET.

Next, the spacers 21 are selectively removed by wet etching. A replacement gate material (for example, the above metal forming the dummy gate 16) is then deposited on the whole surface of the semiconductor structure. The replacement gate material should have a thickness sufficient for filling up the gate opening.

Next, CMP is performed on the replacement gate material to obtain a flat structure surface. In the present application, the term "flat", "planar" or "flush" means that a height difference between any two points in a plane is within a process tolerance. During CMP, the previously formed interlayer dielectric layer 20 is used as a stop layer such that the portion of the replacement gate material outside the gate opening can be removed completely. The remaining portion of the replacement gate material in the gate opening forms a replacement gate 22 as shown in FIG. 10.

Preferably, in the above steps, the gate dielectric layer 15 may also be removed after the spacers 21 are removed, if necessary. A new high-K dielectric layer is then formed on the bottom and the inner walls of the gate opening. For example, the new high-K dielectric layer can be the one selected from a group consisting of $HfO_2$, HfSiO, HfSiON, HfTaO, HfTiO, HfZrO, $Al_2O_3$, $La_2O_3$, $ZrO_2$ and LaAlO, or any combination thereof. The high-K dielectric layer may have a thickness of about 1 nm to 3 nm.

More preferably, after the new high-K dielectric layer is formed, a threshold adjustment layer (for example, TiN, TaN, TiAlN, and TaAlN) is formed in the gate opening before the replacement gate material.

Figure 10:
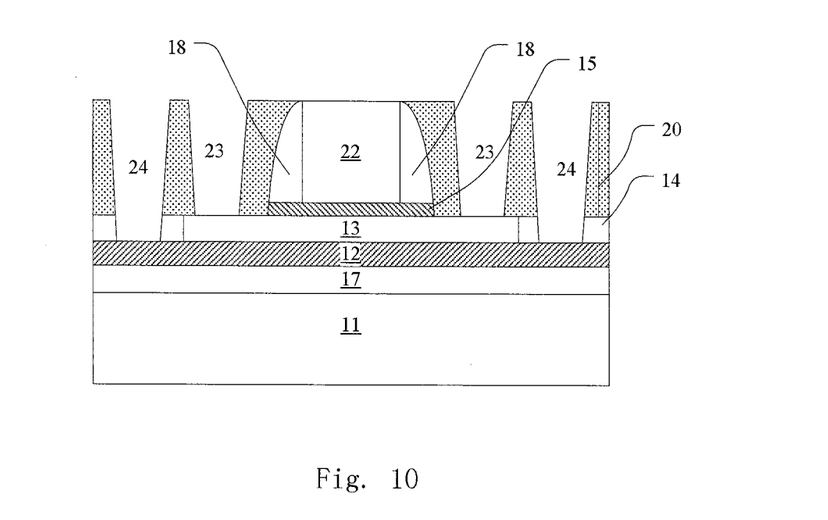

Next, via holes 23 and 24 are formed, as shown in FIG. 10. The via holes 23 extend through the interlayer dielectric layer 20 and reach the source region and the drain region. The via holes 24 extend through the interlayer dielectric layer 20, the shallow trench isolation 14 and the buried insulator layer 12 and reach the back gate 17.

Figure 11:
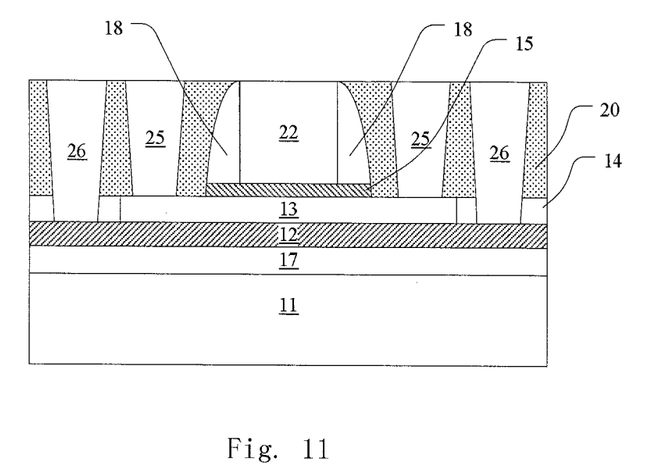

Next, the via holes 23 and 24 are filled with a metal to form conductive vias 25, which are electrically connected to the source region and the drain region, and conductive vias 26, which are electrically connected to the second compensation doping region in the back gate 17, as shown in FIG. 11.

The steps for forming the MOSFET according to the present disclosure are described above in connection with FIGS. 1 to 11.

Figure 12:
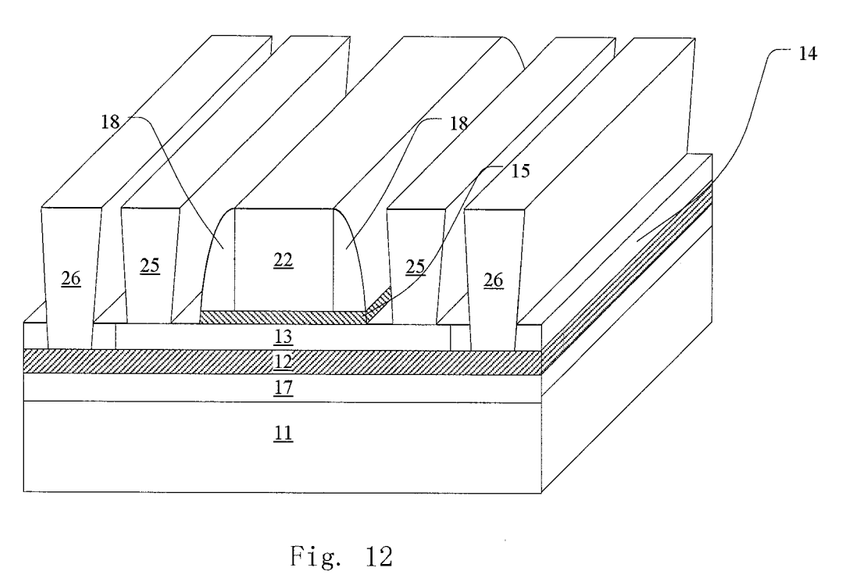
FIG. 12 schematically shows a perspective view of a MOSFET according to the present disclosure.

FIG. 12 schematically shows a perspective view of a MOSFET according to the present disclosure. The MOSFET comprises an SOI wafer, which comprises a semiconductor substrate 11, an buried insulator layer 12, and a semiconductor layer 13, the buried insulator layer 12 being disposed on the semiconductor substrate 11, and the semiconductor layer 13 being disposed on the buried insulator layer 12; a gate stack, which is disposed on the semiconductor layer 13; a source region and a drain region, which are disposed in the semiconductor layer 13 and on opposite sides of the gate stack; and a channel region, which are disposed in the semiconductor layer 13 and sandwiched by the source region and the drain region, wherein the MOSFET further comprises a back gate 17 in the semiconductor substrate 11.

The back gate 17 comprises first, second and third compensation doping regions, the first compensation doping region 17a is disposed under the source region and the drain region; the second compensation doping region 17b extends in a direction away from the channel region and adjoining the first compensation doping region 17a; and the third compensation doping region 17c is disposed under the channel region and adjoining the first compensation doping region 17a.

In this embodiment, in order to increase a threshold voltage of the N-type MOSFET unitizing a doping profile of the back gate 17, the first compensation doping region 17a has a reduced effective doping concentration of P-type dopant; the second compensation doping region 17b has an increased effective doping concentration of the P-type dopant; and the third compensation doping region 17c has an effective doping concentration of N-type dopant.

The first compensation doping region 17a has a reduced effective doping concentration such that a parasitic capacitance between the source/drain regions and the back gate 17 are reduced. The second compensation doping region 17b is electrically connected to the back gate through the conductive vias 26 such that contact resistance of the back gate 17 is reduced. The third compensation doping region 17c applies a bias electric field to the channel such that the threshold voltage can be adjusted.

Optionally, the back gate 17 may adjoin the buried insulator layer 12. Optionally, the third compensation doping region 17c may have a depth larger than that of the back gate 17. Optionally, the isolated regions 14 may have a depth larger than that of the back gate 17 for isolating for separating the MOSFET and other MOSFETs. Optionally, the first compensation doping region 17a may have a doping concentration of about $1\times10^{17}$-$1\times10^{20}$ $cm^{-3}$. Optionally, the third compensation doping region 17c may have a doping concentration of about $1\times10^{15}$-$1\times10^{18}$ $cm^{-3}$. Optionally, the third compensation doping region 17c may have a doping concentration of about $1\times10^{17}$-$1\times10^{20}$ $cm^{-3}$. Optionally, doping elements in the back gate 17 and the first, second and third compensation doping regions may be one of boron, indium, phosphor, arsenic and antimony, or any combination thereof, respectively.

In the present disclosure, the first, second and third compensation doping regions are formed in the back gate 17 such that a non-uniform doping profile is introduced. When the back gate 17 is applied with a bias voltage, the back gate 17 in turn applies a non-uniform bias electric field to the source region, the drain region and the channel region to control the electric characteristic of the MOSFET. Therefore, short channel effects in the MOSFET are suppressed. The MOSFET can have a reduced parasitic capacitance and a reduced contact resistance in connection with the back gate 17. Furthermore, the MOSFET according to the present disclosure can have an increased threshold voltage.

The above description is directed to the embodiment in which the N-type MOSFET has an increased threshold voltage utilizing a doping profile of the back gate. However, the first, second and third compensation doping may be performed with the dopants of opposite types to decrease the threshold voltage of the device, for an N-type MOSFET.

Furthermore, obvious variations may be made for a P-type MOSFET by those skilled in the art. The structures, materials and methods for various parts in the variations of the above embodiments are similar to those having been described for the embodiment of the method for manufacturing the MOSFET. Detailed description is omitted here for simplicity.

While the disclosure has been described with reference to specific embodiments, the description is illustrative of the disclosure. The description is not to be considered as limiting the disclosure. Various modifications and applications may occur for those skilled in the art without departing from the true spirit and scope of the disclosure as defined by the appended claims.

We claim:

1. A MOSFET, comprising:
an SOI wafer, which comprises a semiconductor substrate, a buried insulator layer, and a semiconductor layer, the buried insulator layer being disposed on the semiconductor substrate, and the semiconductor layer being disposed on the buried insulator layer;
a gate stack, which is disposed on the semiconductor layer;
a source region and a drain region, which are disposed in the semiconductor layer and on opposite sides of the gate stack; and
a channel region, which is disposed in the semiconductor layer and between the source region and the drain region,
wherein the MOSFET further comprises a back gate disposed in the semiconductor substrate, and
wherein the back gate comprises first, second, and third compensation doping regions, the first compensation doping region is disposed under the source region and the drain region; the second compensation doping region extends in a direction away from the channel region and adjoining the first compensation doping region; and the third compensation doping region is disposed under the channel region and adjoining the first compensation doping region.

2. The MOSFET according to claim 1, wherein both the first compensation doping region and the second compensation doping region have a first doping polarity; the third compensation doping region has a second doping polarity; and the first doping polarity is opposite to the second doping polarity.

3. The MOSFET according to claim 1, wherein both the first compensation doping region and the second compensation doping region have a first doping polarity; the third compensation doping region has the first doping polarity; and the doping concentration of the third compensation doping region is less than the doping concentration of the first compensation doping region and the second compensation doping region.

4. The MOSFET according to claim 1, wherein the first doping polarity is opposite to the doping polarity of the MOSFET.

5. The MOSFET according to claim 1, wherein the first doping polarity is identical to the doping polarity of the MOSFET.

6. The MOSFET according to claim 1, wherein the back gate adjoins the buried insulator layer.

7. The MOSFET according to claim 1, wherein the compensation doping region has a depth larger than that of the back gate.

8. The MOSFET according to claim 1, further comprising an isolating region for separating the MOSFET and other MOSFETs, wherein the isolation region has a depth larger than that of the back gate.

* * * * *